(12) United States Patent
Garnier

(10) Patent No.: US 6,356,121 B1
(45) Date of Patent: Mar. 12, 2002

(54) VERY LOW-POWER COMPARISON DEVICE

(75) Inventor: Christophe Garnier, Theys (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 09/808,744

(22) Filed: Mar. 15, 2001

(30) Foreign Application Priority Data

Mar. 21, 2000 (FR) .............................................. 00 03608

(51) Int. Cl.[7] .................................................. H03K 5/22
(52) U.S. Cl. ............................. 327/66; 327/67; 327/563
(58) Field of Search .......................... 327/52–54, 65–67, 327/77, 89, 560–563, 72, 205, 206; 330/252, 253, 310, 311; 323/316

(56) References Cited

U.S. PATENT DOCUMENTS

| | | | |
|---|---|---|---|
| 5,475,323 A | * 12/1995 | Harris et al. | .................... 327/65 |
| 5,734,272 A | * 3/1998 | Belot et al. | ..................... 327/65 |
| 5,754,076 A | 5/1998 | Kimura | ........................ 327/563 |
| 5,909,136 A | 6/1999 | Kimura | ........................ 327/356 |
| 6,127,868 A | * 10/2000 | Phillips | ......................... 327/66 |

FOREIGN PATENT DOCUMENTS

| | | | |
|---|---|---|---|
| EP | 0597420 | 5/1994 | ............. H03F/1/32 |
| EP | 0776087 | 5/1997 | ............. H03F/1/02 |
| EP | 0915562 | 5/1999 | ............. H03F/3/45 |

OTHER PUBLICATIONS

Shin et al., Design of a Programmable Slew–Rate Op Amp, Proceedings of the Midwest Symposium on Circuits and Systems, US, New York, IEEE, vol. SYMP. 37, Aug. 3, 1994, pp. 142–146, XP000531995.

* cited by examiner

*Primary Examiner*—Toan Tran
(74) *Attorney, Agent, or Firm*—Lisa K. Jorgenson; Allen, Dyer, Doppelt, Milbrath & Gilchrist, P.A.

(57) ABSTRACT

A device for comparing two input signals includes a first comparator with differential outputs to whose inputs the signals are applied. The first comparator is followed by a second comparator delivering an output logic signal of the device. Each comparator includes at least one input differential stage, and each stage has two arms biased by a bias current generator. The comparison device may also include at least one additional current supply circuit associated with an arm of the input differential stage of the first comparator to copy the current of the arm and add it, with a multiplier factor, to the bias current of the input differential stage of the second comparator. This facilitates a corresponding switchover.

17 Claims, 4 Drawing Sheets

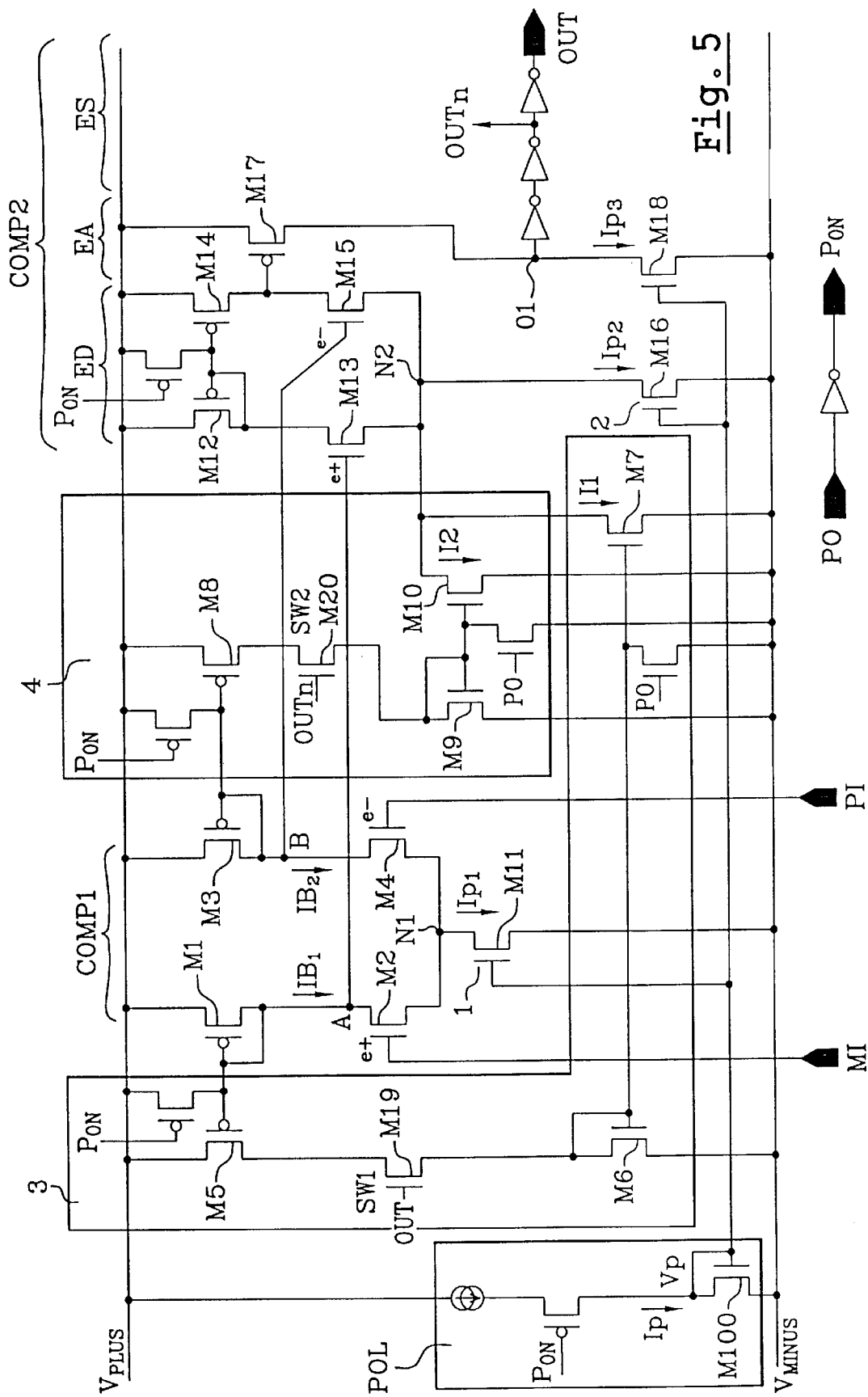

VERY LOW-POWER COMPARISON DEVICE

FIELD OF THE INVENTION

The present invention relates to the field of electronic circuits, and, more particularly, to low-power comparison devices. The present invention is particularly well suited for applications in which power consumption is limited, especially in electronic equipment powered by a battery.

BACKGROUND OF THE INVENTION

One application in which comparison devices with low power consumption are used is the biomedical field, such as in portable equipment or sensors. In this application, the electronic equipment should consume as little power as possible because the total current available is very limited. One microampere typically corresponds to an available order of magnitude.

When the consumption of an electronic device is reduced, its performance characteristics are generally reduced as well. This is especially the case with comparison devices. To reduce their consumption, the bias current is typically reduced. Yet, the more the bias current is reduced, the lower the efficiency of these devices. That is, their switch-over operation becomes very slow. For example, a standard prior art comparator, biased at 60 microamperes, switches over in about one hundred nanoseconds. When biased at 500 nanoamperes, it will switch over in six microseconds.

A prior art comparison device for comparing two weak signals MI and PI applied at its input is shown in FIG. 1 in an exemplary metal oxide semiconductor (MOS) technology embodiment. In general, one of the two signals is a reference signal. The signal MI is a reference signal with a level assumed to be constant, and the signal PI is a signal with a variable level given by any unspecified electronic circuit (not shown). This circuit may, for example, be a measurement circuit.

When weak signals have to be compared, the comparison device usually includes two series-connected comparators, namely a first comparator to amplify the signals to be compared followed by a second comparator with a very high gain. The comparison device illustrated in FIG. 1 thus includes a first comparator COMP1 with differential outputs A and B followed by a second comparator COMP2 with very high gain that delivers a logic signal OUT at its output. The output logic level indicates which of the input signals MI or PI is greater than the other one.

The signal MI is applied to the non-inverting input e+ of the first comparator and the signal PI is applied to the inverting input e−. The first arm of the comparator COMP1, associated with the non-inverting input e+, includes a first MOS transistor M1 mounted as a diode with its gate and drain connected. The first MOS transistor M1 is series-connected with a second MOS transistor M2 between the power supply voltage $V_{PLUS}$ and a current bias node N1. The second transistor M2 receives the signal MI at its gate. The second arm of the comparator COMP1, associated with the inverting input e−, similarly includes a first MOS transistor M3 mounted as a diode with its gate and drain connected. The first MOS transistor M3 is series-connected with a second MOS transistor M4 between the power supply voltage $V_{PLUS}$ and the current bias node N1. The second transistor M4 receives the signal PI at its gate.

The comparator COMP1 further includes a current generator 1 connected between the bias node N1 and the power supply voltage $V_{MINUS}$. In this configuration, if the level of the signal MI is greater than that of the signal PI, the current in the first arm of the comparator COMP1 gradually rises from 0 to the bias current level Ip1 (which the current generator 1 can provide) while no current flows in the second arm.

The very-high-gain comparator COMP2, which is not illustrated in detail in FIG. 1, includes a first amplifier stage with differential inputs followed by a direction stage and an output stage to reshape the signal. The differential input amplifier stage is biased by a current Ip2 given by a current generator. In practice, Ip1 may be equal to Ip2. Thus, in the second comparator COMP2, since the current Ip2 is also very low (i.e., in the range of 500 nanoamperes), the switch-over is also very slow.

SUMMARY OF THE INVENTION

An object of the invention is to improve the switch-over performance characteristics of a comparator under low bias current.

Yet another object of the invention is to provide a very low power comparison device with improved switch-over speed.

Referring again to FIG. 1, the basic idea of the invention is to use the current flowing into an arm of the first comparator and apply it with a multiplier coefficient to the second comparator as a complement of the current Ip2. Thus, the switch-over is accelerated in the second comparator, enabling a substantial improvement of the performance characteristics of the comparison device. Thus, if a device is provided within the comparison device for copying and providing an additional supply of current from the first arm of the comparator COMP2 as an additional bias current in the comparator COMP2, the corresponding switch-over is accelerated to a signal level PI which becomes lower than that of the signal MI.

To accelerate the reverse switch-over, when the level of the signal PI becomes greater than that of the signal MI, it is necessary to provide a similar device on the other arm of the comparator COMP1. Once the comparator COMP2 has changed over, the bias current is again at its maximum level, corresponding to the sum of the bias current Ip2 of the second comparator and the bias current Ip1 of the first comparator multiplied by the multiplier factor K. Since there is no need for the current outside the zones close to the switch-over, each additional current supply device may be cut off as soon as the output of the comparison device has changed over to the corresponding direction. Thus, for each additional-current supply device, a switch controlled by the appropriate logic level of the output signal of the comparison device may be used.

According to the invention, a device for comparing two input signals includes a first comparator with differential outputs to whose inputs the signals are applied. The first comparator is followed by a second comparator delivering an output logic signal of the device. Each comparator includes at least one input differential stage, and each stage has two arms biased by a bias current generator. The comparison device may also include at least one additional current supply circuit associated with an arm of the input differential stage of the first comparator to copy the current of the arm and add it, with a multiplier factor, to the bias current of the input differential stage of the second comparator. This facilitates a corresponding switch-over.

BRIEF DESCRIPTION OF THE DRAWINGS

Other features and advantages of the invention are explained in the following description, given by way of a non-limitative embodiments of the invention and with reference to the appended figures, in which:

FIG. 5 is a schematic diagram illustrating a more detailed and exemplary embodiment of the comparison device shown in FIG. 4 implemented using complementary MOS (CMOS) technology.

DETAILED DESCRIPTION OF THE PREFERRED EMBODIMENTS

Figure 1:
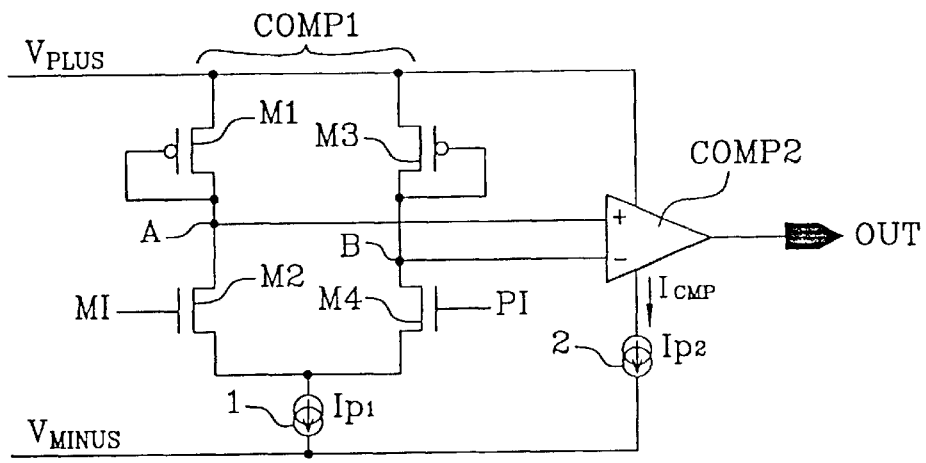
FIG. 1 (previously described) is a schematic diagram illustrating a prior art comparison device.
Figure 2:
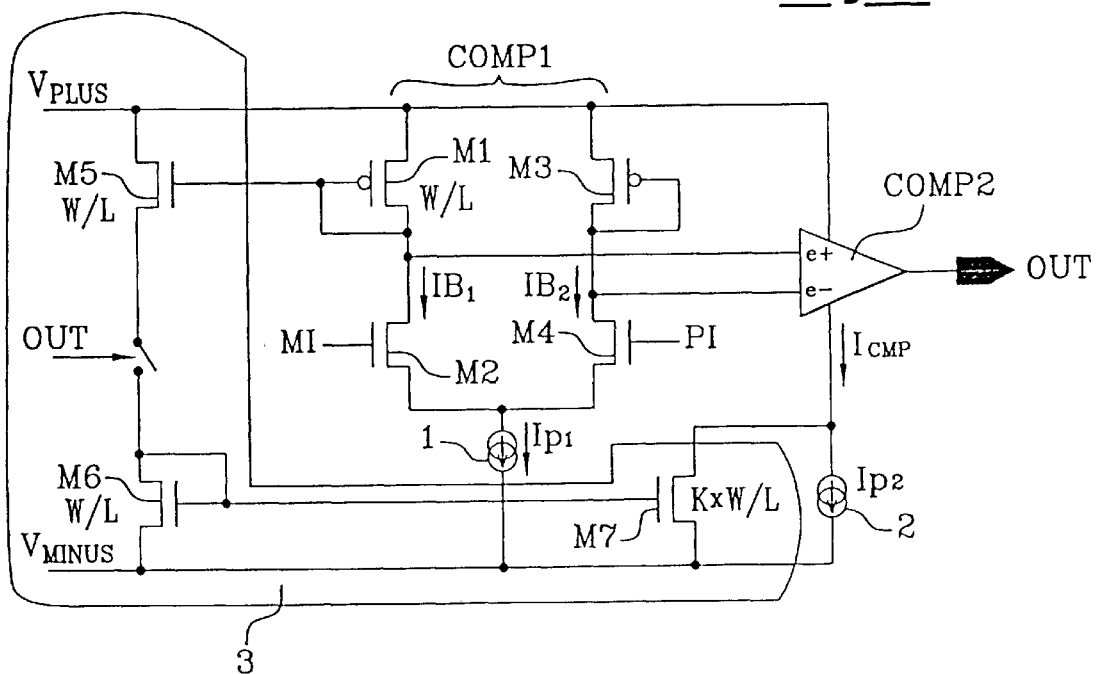
FIG. 2 is a schematic diagram illustrating a comparison device according to the invention.

Turning to FIG. 2, a comparison device according to the invention is now described. In addition to the elements previously described with reference to FIG. 1, the comparison device has a circuit 3 for copying the current of the first arm of the comparator COMP1 and supplying this current as an additional bias current to the comparator COMP2. The current copying and additional supply circuit 3 is based upon a current mirror structure. It has a first current mirror to recover the current IB1 from the first arm and a second current mirror to apply a multiplier factor K thereto as an additional bias current in the comparator COMP2.

The circuit 3 for supplying additional bias current includes two MOS transistors M5 and M6 series-connected between the supply voltage $V_{PLUS}$ and the supply voltage $V_{MINUS}$. The first transistor M5 and the MOS transistor M1 of the first arm are of the same type, namely of the P type in the illustrated embodiment. Their gates are connected to one another. The transistors M1 and M5 may furthermore have the same W/L geometrical ratio. The transistors M1 and M5 thus form a current mirror structure with a gain of unity, by which the current IB1 in the first arm is copied into the transistor M5.

The circuit 3 has another MOS transistor M7 connected between a bias node N2 of the second comparator COMP2 and the power voltage $V_{MINUS}$. The transistors M6 and M7 are of the same type, namely of the N type in the illustrated embodiment. Their gates are connected to each other. The transistor M6 is furthermore mounted as a diode with its gate connected to its drain. The MOS transistor M7 has a W/L geometrical ratio that is K times greater than that of the transistor M6. The transistors M6, M7 thus form a current mirror structure with a multiplier factor K so that the current IB1 copied in the transistor M5 is copied with a multiplier factor K into the transistor M7. The multiplier factor K may be on the order of 10, for example.

According to the invention, to avoid any unnecessary excess consumption, the additional supply of bias current may be cut off as soon as the corresponding switch-over at the output is complete. This cut off function is achieved in the circuit 3 by a switch SW1 controlled by the output signal OUT. The switch SW1 is closed when the output OUT is in the logic state 1, and it is open when the output OUT is in the logic state 0. When the switch SW1 is open, the bias current $I_{CMP}$ of the comparator COMP2 is equal to the current Ip2. When the switch SW1 is closed, the current $I_{CMP}$ is equal to $I_{CMP}=Ip2+K*Ip1$.

Figure 3:
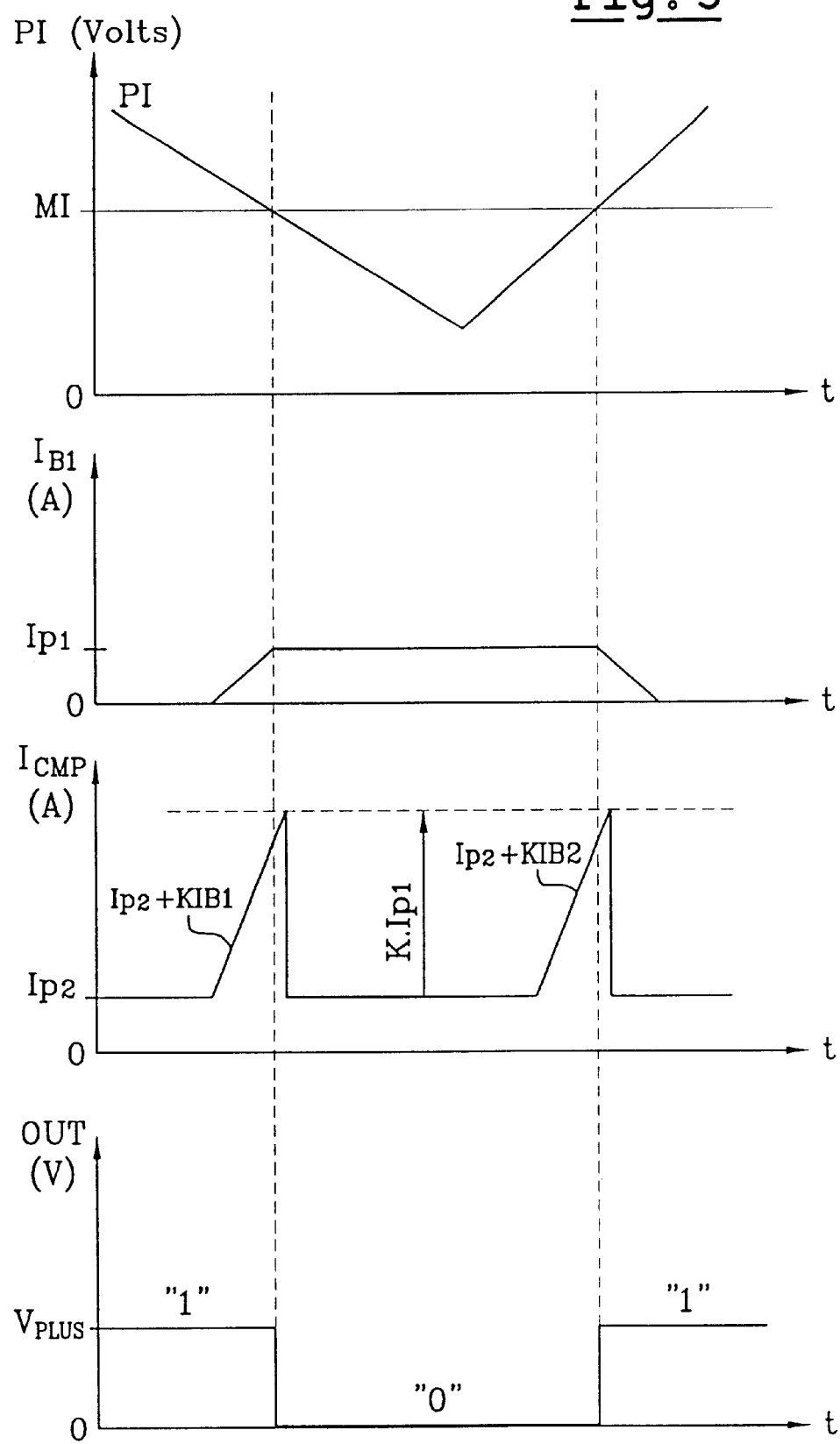
FIG. 3 are graphs illustrating variation of the bias current of the input differential stage of the second comparator according to a variation of the signal PI with reference to the signal MI.

Thus, as shown in part I of FIG. 3, if we start from a state in which the level of the signal PI is greater than the level of the signal MI, the switch SW1 is closed (output OUT at 1). If the level of the signal PI becomes lower than that of the signal MI, the current IB1 in the first arm of the comparator COMP1 rises from 0 to the level of the bias current Ip1 given by the current generator 1. As soon as the current IB1 becomes non-zero, the bias current $I_{CMP}$ in the comparator COMP2 has its value augmented from the level of the bias current Ip2 given by the current generator 2 to the maximum level given by Ip2+K*Ip1 (the same references are used for the signals and their values of intensity). As soon as the comparator COMP2 switches over, its output OUT changes its logic state. In the example, this output OUT switches from 1 to 0, as shown in FIG. 3.

Figure 4:
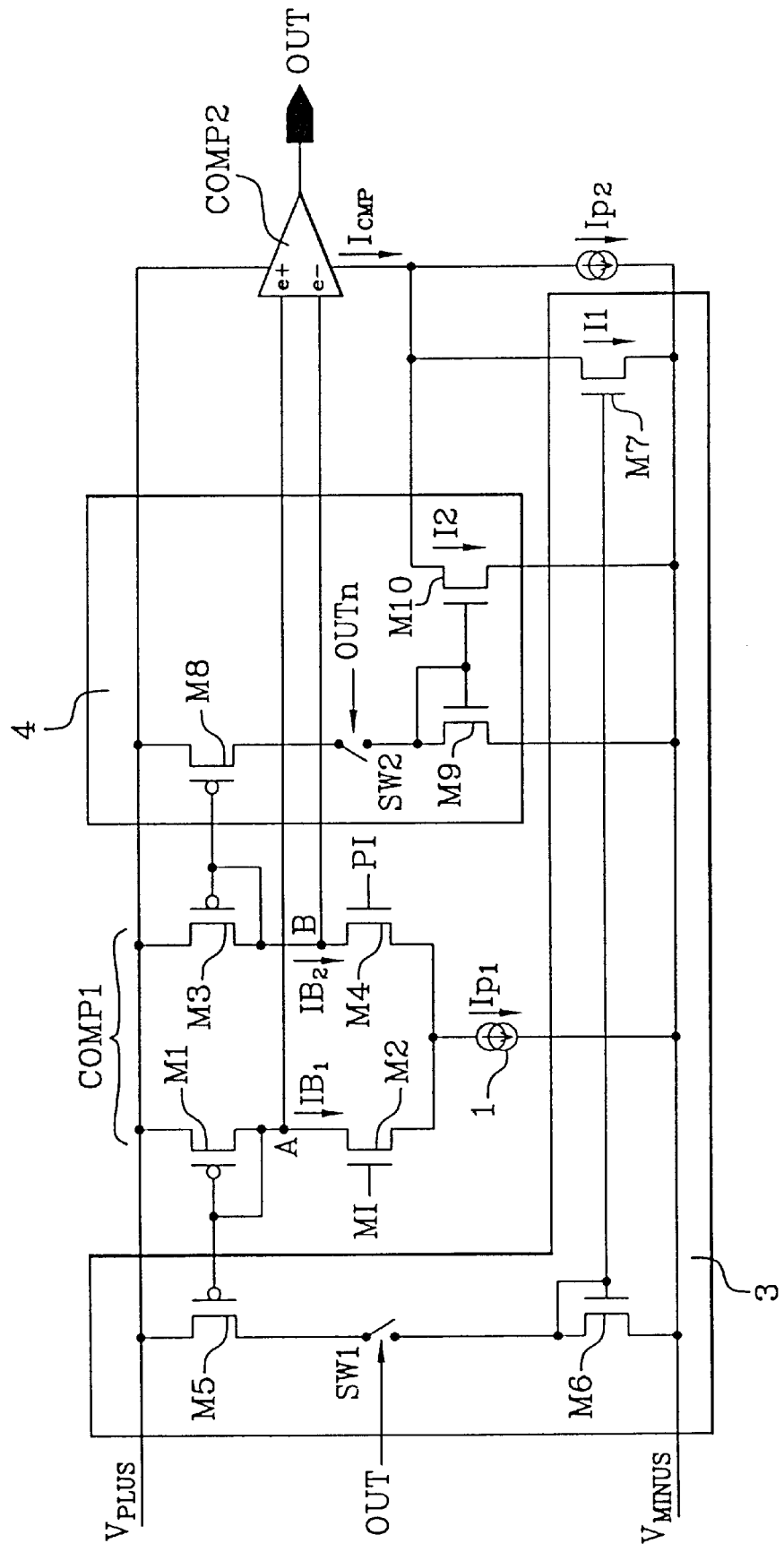
FIG. 4 is a schematic diagram illustrating an alternative embodiment of the comparison device according to the invention.

Turning to FIG. 4, an alternative embodiment of a comparison device according to the invention is illustrated. With the device illustrated in FIG. 2, only the switch-over in the comparator COMP2 corresponding to the change-over of the output OUT of the device from 1 to 0 is accelerated. If it is desired to accelerate the reverse switch-over, it is necessary to include a similar system on the other arm of the comparator COMP1.

The comparison device shown in FIG. 4 therefore includes, in addition to all of the elements of the comparison device of FIG. 2, another circuit 4 for supplying additional bias current to add a current to the bias current Ip2 of the second comparator COMP2. This current is equal to K' times the current IB2 of the second arm of the comparator COMP2. Hereinafter, it will be assumed that K=K'.

When the level of the signal PI becomes greater than the level of the signal MI, the current IB2 in the second arm rises from 0 to the level of the bias current Ip1. In the same period of time, the level of the current IB1 falls from Ip1 to 0. The current IB2 is applied, with the multiplier factor K, to the comparator COMP2 as an additional bias current. Thus, the bias current ICMP becomes equal to $I_{CMP}=Ip2+K*IB2$, whose maximum value is given by Ip2+K*Ip1. As soon as the comparator COMP2 switches over (which corresponds to the change-over of the output OUT of the device from 0 to 1), this additional bias current supply can be cut off.

Thus, the current supply circuit 4 associated with the second arm of the comparator COMP1 has the same structure with MOS transistors M8, M9 and M10 and switch SW2 as the current supply circuit 3 associated with the first arm. The switch SW2 is controlled by the reverse signal OUTn of the output OUT of the comparison device so that it is open when this output OUT is at 1 and closed when this output is at 0.

The invention that has just been described can be applied generally to a comparison device including two input differential stage comparators. Each stage is current biased by a current generator to accelerate the switch-over in the second comparator in at least one direction. This is done by providing for the supply of additional bias current in the input differential stage of the second comparator from the current of an arm corresponding to the direction of the switch-over in the first comparator.

Referring additionally to FIG. 5, an exemplary view of a detailed embodiment of a comparison device according to the invention implemented using CMOS technology is illustrated. This comparison device may be used to accelerate the switch-over in the second comparator in both directions while providing for a minimum power consumption by the comparison device outside the switch-over zones. This device includes two comparators COMP1 and COMP2, each including an input differential stage and two circuits for supplying additional current, one per arm of the first comparator COMP1.

The first comparator COMP1 includes an input differential stage with differential outputs A and B, the two arms of which have already been described above with reference to FIG. 1. This differential stage is biased at the node N1 by a bias current generator which includes a current bias MOS transistor M11 controlled at its gate by a reference voltage Vp. The second comparator COMP2 is of a very-high-gain type. It includes an input differential stage ED followed by a second amplifier stage EA and an output stage ES including three inverter stages. The output signal OUT of the comparator COMP2 is given by the reshaping output stage.

The output signals A and B of the comparator COMP1 are applied to the differential stage. As illustrated in FIG. 5, the signal A is applied to the non-inverting input e+ and the signal B is applied to the inverting input e−. The input differential stage ED has two arms, each connected between the supply voltage $V_{PLUS}$ and a current bias node N2. The first arm has a PMOS transistor M12 mounted as a diode (with the gate and drain short-circuited) and an NMOS transistor M13. These two transistors are series-connected between the supply voltage $V_{PLUS}$ and the node N2.

The second arm has a PMOS transistor M14 whose gate is connected to the gate of the transistor M12 (current mirror) and an NMOS transistor M15. The transistors M14 and M15 are series-connected between the supply voltage $V_{PLUS}$ and the node N2. The connection point between the transistors M14 and M15 gives the output of this stage, which is applied to the input E1 of the second amplifier stage EA. The bias current generator 2 includes a current bias MOS transistor M16 connected between the node N2 and the supply voltage $V_{MINUS}$ that is controlled at its gate by the reference voltage Vp.

The gate of the transistor M13 forms the non-inverting differential input e+ of the comparator COMP2 receiving the signal A. The gate of the transistor M15 forms the inverting differential input e− of the comparator COMP2 receiving the signal B. The second amplifier stage EA of the comparator COMP2 includes a PMOS transistor M17 connected between the power supply voltage $V_{PLUS}$ and a node O1. A current Ip3 biasing a MOS transistor M18 is connected between the node O1 and the supply voltage $V_{MINUS}$ and is controlled at its gate by the reference voltage Vp. The node O1 is applied to the input of the output stage ES. The output stage ES has three series-connected CMOS type inverters INV1, INV2, INV3 to give, at the output, a reshaped signal OUT that forms the output signal of the comparison device.

The current bias transistors M14, M16, M18 are MOS transistors of a same type (N type transistors in FIG. 5) which are controlled by the same reference voltage Vp. The reference voltage Vp may be provided by a current mirror circuit POL including a MOS transistor M100 connected as a diode (i.e., with its gate and drain connected) so that, in each of the bias transistors M14, M16 and M18, a current equal to M times the reference current Ip is provided. The current multiplier M is equal to the ratio of the W/L coefficient of the bias transistor to that of the diode-mounted transistor (M100). If M=1 for each bias transistor, then Ip1=Ip2=Ip3=Ip. In an exemplary application using very low voltage, the bias current Ip is less than about one hundred nanoamperes, e.g., in the range of 50 nanoamperes.

The comparison device furthermore has two circuits for supplying additional current, one per arm of the comparator COMP1. These circuits have already been described in detail with reference to FIG. 4. In FIG. 5, the switches SW1 and SW2 are each formed by a P type MOS transistor. The first transistor M19 is controlled by the output signal OUT, the second transistor M20 is controlled by the signal OUTn, which may be taken between the second and third inverters of the output stage ES of the comparator COMP2.

Each of these circuits for supplying additional bias current is used to accelerate the switch-over in the second comparator. The additional current supply circuit associated with the first arm is effective as soon as the first selector switch detects that the level of the signal PI passes below the level of the signal MI. The resulting effect is to temporarily augment the bias current in the second selector switch facilitating the corresponding switch-over, i.e., the switch-over from 1 to 0 of the output OUT. As soon as this output switches over, it opens the switch SW1 (M19). This eliminates the current supply in the second comparator, minimizing the power consumption.

Further, the switch SW2 (M20) closes at the same time, making the additional current supply circuit associated with the second arm active. The comparison device is then in the optimum condition for the following reverse switch-over. So long as the level of the signal PI remains below that of the signal MI, the bias current of the second comparator remains equal to Ip2. This is because no current flows in the second arm of the comparator COMP1 (IB1=Ip1 and IB2=0).

When the level of the signal PI becomes greater than that of the signal MI, the current IB2 in the second arm of the comparator COMP1 rises from 0 to the level of the bias current Ip1 (while the current IB1 in the other arm falls from the level of the bias current Ip1 to 0). As soon as the current IB2 becomes non-zero, it is applied with a multiplier factor K as an additional bias current to the node N2. This facilitates the switch-over in the input differential stage of the comparator COMP2. As soon as the output OUT of the device has changed over from 0 to 1, this additional supply of current is stopped by the opening of the switch SW2. At the same time, the switch SW1 is closed, placing the comparison device in the optimum condition for the following reverse switch-over. So long as the level of the signal PI remains higher than that of the signal MI, the bias current of the second comparator remains equal to Ip2. This is because no current flows in the first arm of the comparator COMP1 (IB1=0 and IB2=Ip1).

Thus, the comparison device is always in the optimum switch-over condition while having minimum consumption conditions outside the switch-over zone. The comparison device is therefore more particularly useful if the levels of the signals to be compared do not change too often. Otherwise, the operation is always in a switch-over zone in which the bias current of the comparator is high, causing almost permanent excess consumption.

Thus, the invention is more particularly useful for comparing signals MI and PI whose levels are different from each other over a period of time that is lengthy as compared with the switch-over time period. For example, the invention is particularly useful in low-frequency RC oscillators or for the regulation of switched supplies.

FIG. 5 furthermore shows circuits for initializing the comparison device that are activated when the circuit into which it is integrated is powered on. These are typical initializing circuits that are well known in the art and which shall not be described in detail herein. These circuits are controlled by an initializing signal $P_o$ and a reverse $P_{ON}$ initializes the different internal nodes of the comparison device as soon as the powering on of the integrated circuit has been detected.

That which is claimed is:

1. A comparison device for comparing input signals comprising:
    a first input differential stage comprising two arms and receiving the input signals;
    a second input differential stage downstream from said first input differential stage comprising two arms, said second input differential stage delivering an output logic signal of the comparison device;
    at least one bias current generator providing a bias current for biasing said arms of said first and second input differential stages; and
    at least one additional current supply circuit associated with one of said arms of said first input differential stage for copying a current thereof, multiplying the copied current by a factor, and adding the multiplied current to the bias current for biasing said second input differential stage to facilitate a corresponding switch-over thereof.

2. The comparison device according to claim 1 wherein said at least one additional current supply circuit comprises an additional current supply circuit associated with each arm of said first input differential stage.

3. The comparison device according to claim 2 wherein each additional current supply circuit comprises a switch controlled by the output logic signal for shutting said additional current supply circuit off when the corresponding switch-over is completed.

4. The comparison device according to claim 2, wherein each additional current supply circuit comprises a current mirror structure.

5. The comparison device according to claim 1 wherein said at least one bias current generator provides a current of less than about one hundred nanoamperes.

6. A comparison device for comparing two input signals comprising:
    a first comparator comprising a first input differential stage comprising two arms and receiving the two input signals;
    a second comparator downstream from said first comparator and comprising a second input differential stage comprising two arms, said second comparator delivering an output logic signal of the comparison device;
    at least one bias current generator providing a bias current for biasing said arms of said first and second input differential stages; and
    an additional current supply circuit associated with each of said arms of said first input differential stage for copying a current thereof, multiplying the copied current by a factor, and adding the multiplied current to the bias current for biasing said second input differential stage to facilitate a corresponding switch-over thereof.

7. The comparison device according to claim 6 wherein each additional current supply circuit comprises a switch controlled by the output logic signal for shutting said additional current supply circuit off when the corresponding switch-over is completed.

8. The comparison device according to claim 6 wherein each additional current supply circuit comprises a current mirror structure.

9. The comparison device according to claim 6 wherein said at least one bias current generator provides a current of less than about one hundred nanoamperes.

10. An integrated circuit comprising:
    a comparison device for comparing input signals and comprising
        a first input differential stage comprising two arms and receiving the input signals,
        a second input differential stage downstream from said first input differential stage comprising two arms, said second input differential stage delivering an output logic signal of the comparison device,
        at least one bias current generator providing a bias current for biasing said arms of said first and second input differential stages, and
        at least one additional current supply circuit associated with one of said arms of said first input differential stage for copying a current thereof, multiplying the copied current by a factor, and adding the multiplied current to the bias current for biasing said second input differential stage to facilitate a corresponding switch-over thereof.

11. The integrated circuit according to claim 10 wherein said at least one additional current supply circuit comprises an additional current supply circuit associated with each arm of said first input differential stage.

12. The integrated circuit according to claim 11 wherein each additional current supply circuit comprises a switch controlled by the output logic signal for shutting said additional current supply circuit off when the corresponding switch-over is completed.

13. The integrated circuit according to claim 11 wherein each additional current supply circuit comprises a current mirror structure.

14. The integrated circuit according to claim 10 wherein said at least one bias current generator provides a current of less than about one hundred nanoamperes, a comparison device according to any of the above claims.

15. A method for comparing input signals using a first input differential stage comprising two arms and receiving the input signals and a second input differential stage downstream from the first input differential stage comprising two arms and delivering an output logic signal, the method comprising:
    providing a bias current for biasing the arms of the first and second input differential stages;
    copying a current from one of the arms of the first input differential stage;
    multiplying the copied current by a factor; and
    adding the multiplied current to the bias current for biasing the second input differential stage to facilitate a corresponding switch-over thereof.

16. The method according to claim 15 further comprising shutting the additional current supply circuit off when the corresponding switch-over is completed.

17. The method according to claim 15 wherein the bias current is less than about one hundred nanoamperes.

* * * * *

UNITED STATES PATENT AND TRADEMARK OFFICE
CERTIFICATE OF CORRECTION

PATENT NO.   : 6,356,121 B1
DATED        : March 12, 2002
INVENTOR(S)  : Christophe Garnier It is certified that error appears in the above-identified patent and that said Letters Patent is hereby corrected as shown below:

Drawings,
FIG. 1,
Delete FIG. 1, Insert New Figure 1:

--

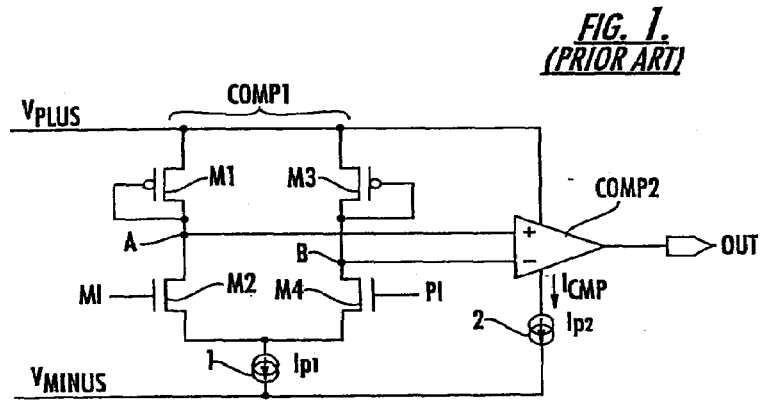

--

FIG. 2,
Delete FIG. 2, Insert New Figure 2:

--

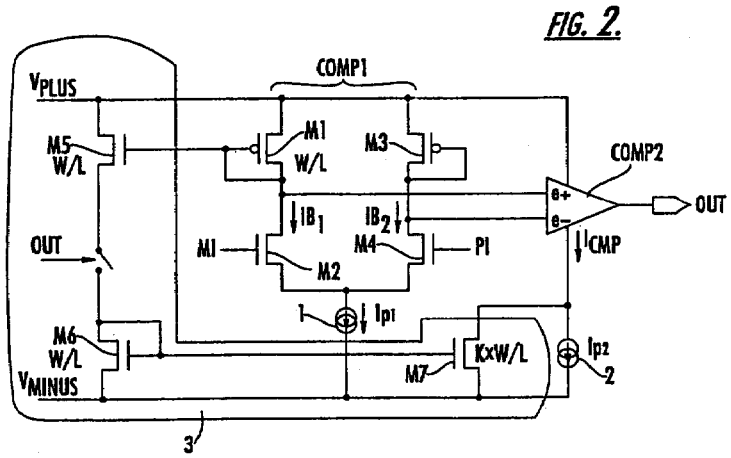

--

UNITED STATES PATENT AND TRADEMARK OFFICE
CERTIFICATE OF CORRECTION

PATENT NO. : 6,356,121 B1
DATED : March 12, 2002
INVENTOR(S) : Christophe Garnier It is certified that error appears in the above-identified patent and that said Letters Patent is hereby corrected as shown below:

FIG. 3,
Delete FIG. 3, Insert New Figure 3:

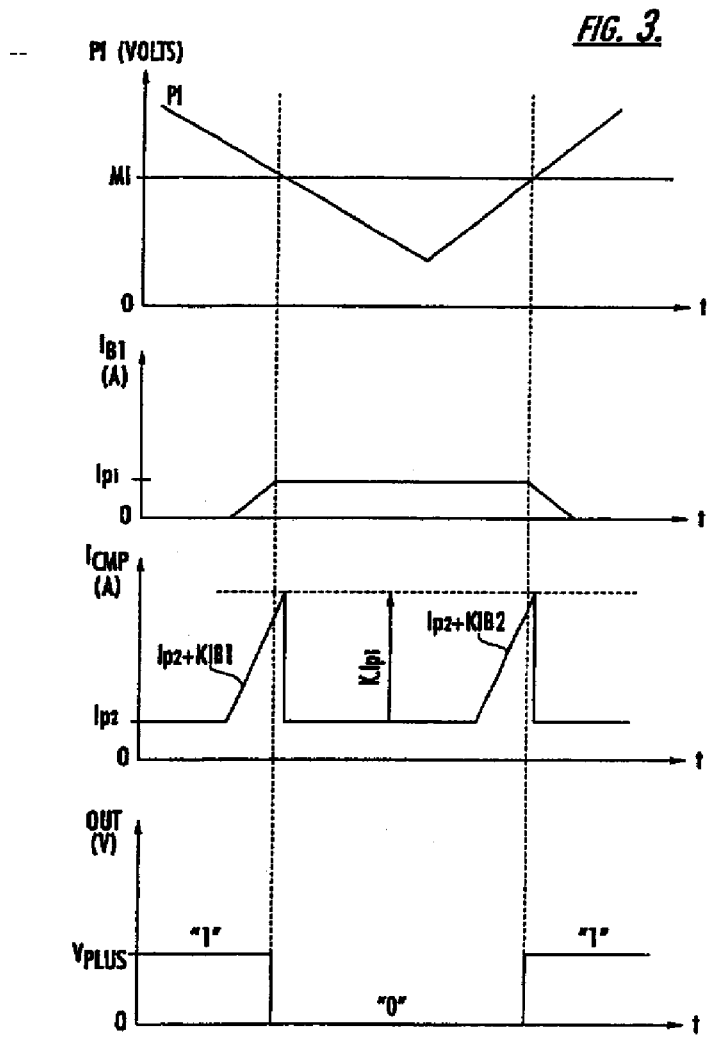

UNITED STATES PATENT AND TRADEMARK OFFICE
CERTIFICATE OF CORRECTION

PATENT NO.     : 6,356,121 B1
DATED          : March 12, 2002
INVENTOR(S)    : Christophe Garnier It is certified that error appears in the above-identified patent and that said Letters Patent is hereby corrected as shown below:

FIG. 4,
Delete FIG. 4, Insert New Figure 4:

--

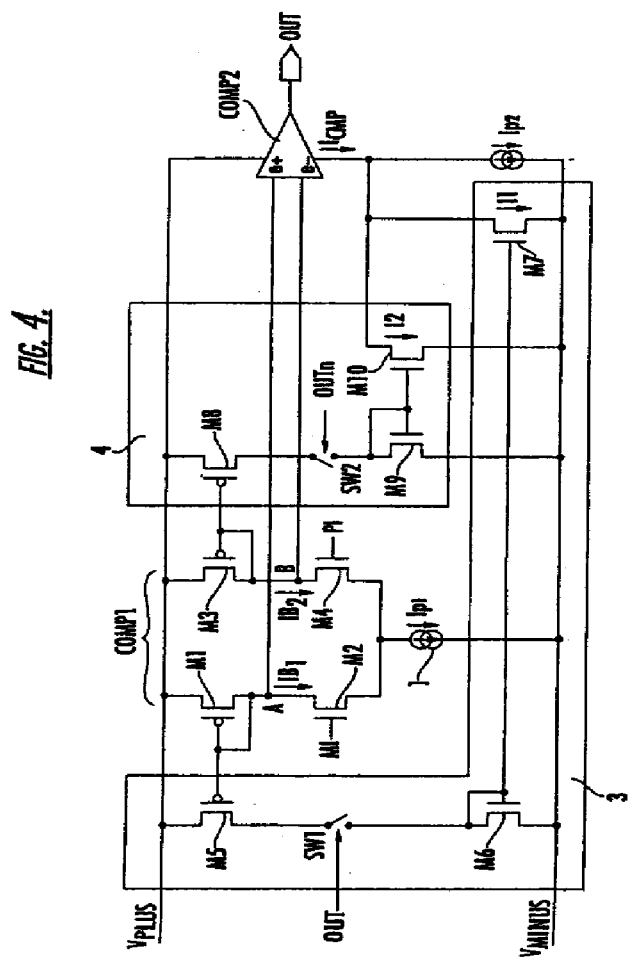

--

UNITED STATES PATENT AND TRADEMARK OFFICE
CERTIFICATE OF CORRECTION

PATENT NO.      : 6,356,121 B1
DATED           : March 12, 2002
INVENTOR(S)     : Christophe Garnier It is certified that error appears in the above-identified patent and that said Letters Patent is hereby corrected as shown below:

FIG. 5,
Delete FIG. 5, Insert New Figure 5:

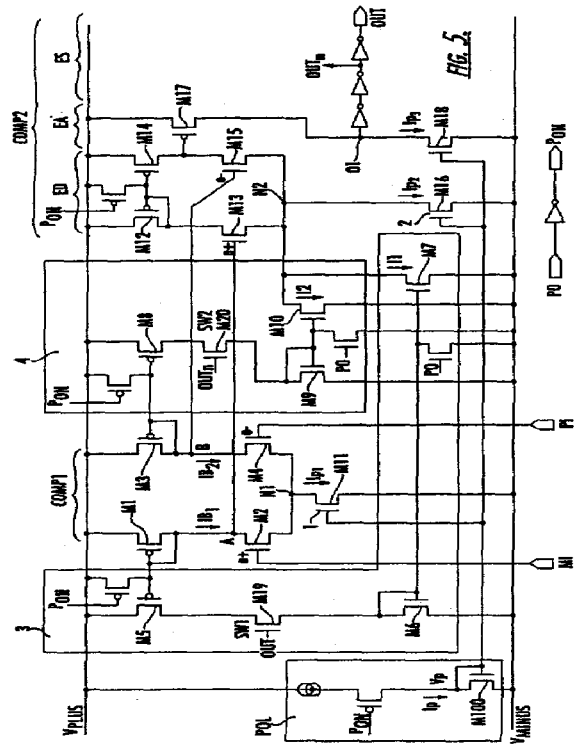

Signed and Sealed this

Second Day of July, 2002

*Attest:*

*Attesting Officer*

JAMES E. ROGAN
*Director of the United States Patent and Trademark Office*